(12) United States Patent
Fukushima et al.

(10) Patent No.: US 10,475,641 B2
(45) Date of Patent: Nov. 12, 2019

(54) SUBSTRATE PROCESSING APPARATUS

(71) Applicant: TOKYO ELECTRON LIMITED, Tokyo (JP)

(72) Inventors: Kohei Fukushima, Oshu (JP); Hiromi Nitadori, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/699,010

(22) Filed: Sep. 8, 2017

(65) Prior Publication Data

US 2018/0076021 A1 Mar. 15, 2018

(30) Foreign Application Priority Data

Sep. 13, 2016 (JP) ................................. 2016-178929

(51) Int. Cl.
*H01L 21/02* (2006.01)
*C23C 16/455* (2006.01)
*C23C 16/44* (2006.01)
*H01L 21/67* (2006.01)

(52) U.S. Cl.
CPC .... *H01L 21/02126* (2013.01); *C23C 16/4412* (2013.01); *C23C 16/45546* (2013.01); *C23C 16/45578* (2013.01); *C23C 16/45589* (2013.01); *H01L 21/0228* (2013.01); *H01L 21/67017* (2013.01); *H01L 21/6719* (2013.01); *H01L 21/67109* (2013.01)

(58) Field of Classification Search
CPC ........... H01L 21/02126; H01L 21/0228; H01L 21/6719; H01L 21/68792; H01L 21/67109; H01L 21/67017; C23C 16/45546; C23C 16/45578; C23C 16/45587; C23C 16/45589; C23C 16/4412; C30B 25/14; C30B 31/16
USPC ................. 118/50, 715; 156/345.19, 345.33; 219/390, 405, 411; 392/416, 418
See application file for complete search history.

(56) References Cited

U.S. PATENT DOCUMENTS 7,749,326 B2 * 7/2010 Kim .................. C23C 16/45508
118/715
9,410,247 B2 * 8/2016 Lee .................... C23C 16/45578
2010/0032425 A1 * 2/2010 Shimada ........... H01L 21/67109
219/439

FOREIGN PATENT DOCUMENTS

JP 5284182 B2 6/2013

* cited by examiner

*Primary Examiner* — Laura Edwards
(74) *Attorney, Agent, or Firm* — Nath, Goldberg & Meyer; Jerald L. Meyer

(57) ABSTRACT

A substrate processing apparatus includes an inner tube installed to accommodate a plurality of substrates and having a first opening, an outer tube configured to surround the inner tube, a movable wall installed inside the inner tube or between the inner tube and the outer tube, configured to be movable, and having a second opening, a gas supply part configured to supply a process gas to the substrates and an exhaust part installed outside the movable wall and configured to exhaust the process gas supplied to the substrates.

10 Claims, 14 Drawing Sheets

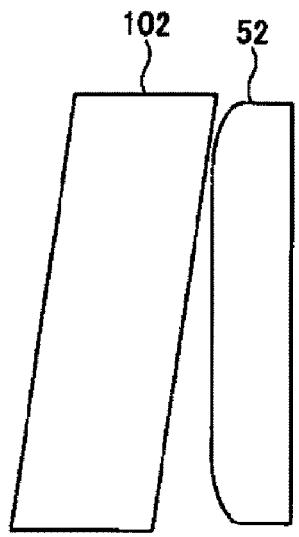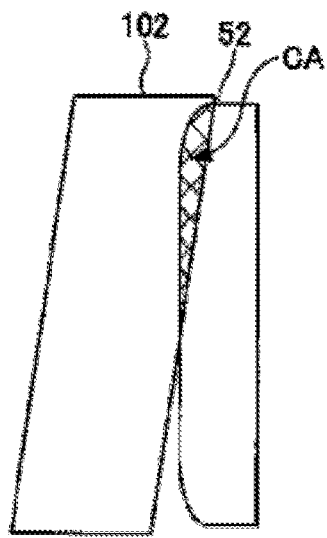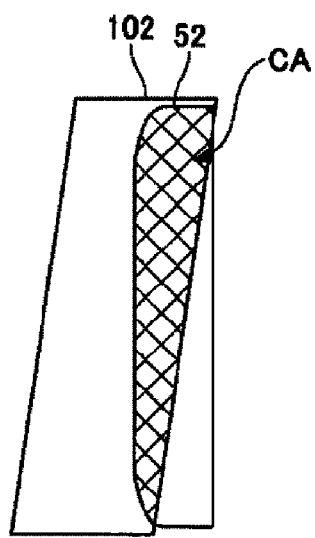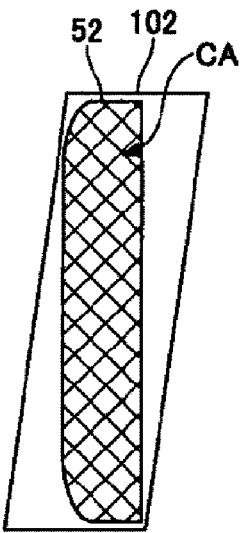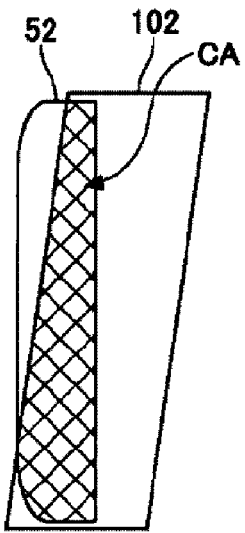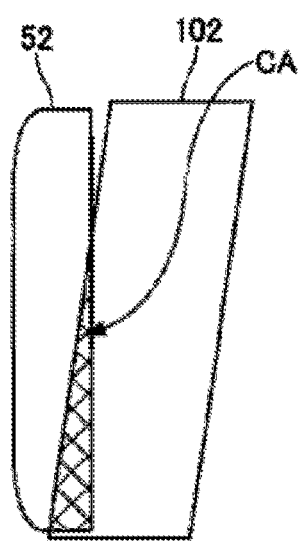

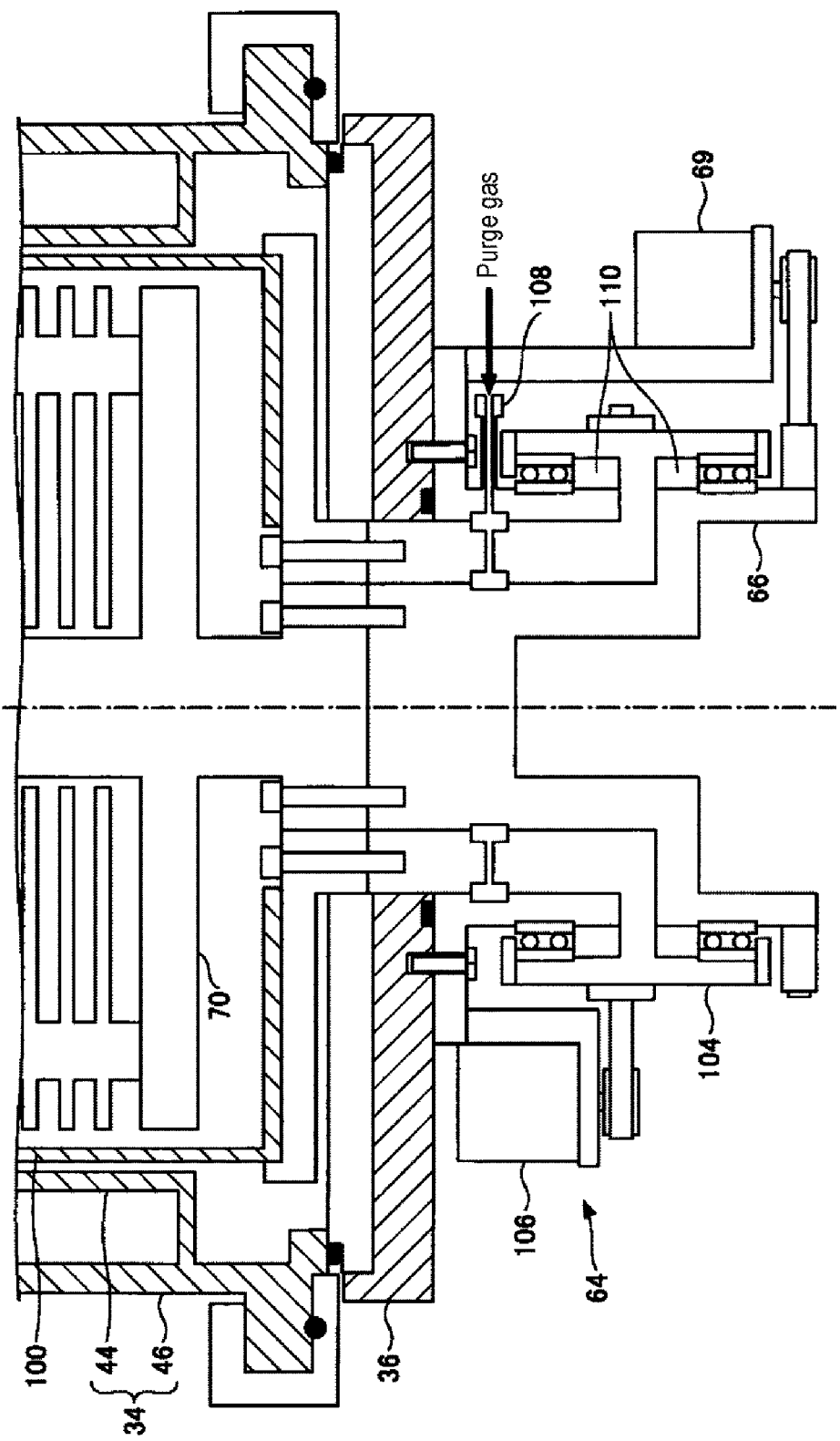

FIG. 8

| ALD Step | Si Flow (Step S1) | Purge (Step S2) | Oxidation (Step S3) | Purge (Step S4) |
|---|---|---|---|---|
| Slit opening | Closed position | Maximum opening | Upper opening | Maximum opening |
| Silicon-containing gas  Supply / Stop | | | | |
| O₃ gas  Supply / Stop | | | | |
| N₂ gas  Supply / Stop | | | | |
| Opening area of common opening | | | | |
| Cross section of process vessel | | | | |

SUBSTRATE PROCESSING APPARATUS

CROSS-REFERENCE TO RELATED APPLICATION(S)

This application is based upon and claims the benefit of priority from Japanese Patent Application No. 2016-178929, filed on Sep. 13, 2016, the entire contents of which are incorporated herein by reference.

TECHNICAL FIELD

The present disclosure relates to a substrate processing apparatus.

BACKGROUND

A batch-type substrate processing apparatus capable of performing a film forming process or the like on a plurality of substrates while supporting the substrates on a substrate support in multiple stages has been known.

As the batch-type substrate processing apparatus, there has been known an apparatus including an inner tube in which the substrates are accommodated, an outer tube surrounding the inner tube, a gas exhaust port installed on a sidewall of the inner tube, and an exhaust unit for exhausting a space interposed between the inner tube and the outer tube. In this apparatus, an exhaust balance is adjusted by gradually narrowing the opening width of the gas exhaust port as it is closer to the exhaust unit, so that the flow velocity of a gas supplied to the surfaces of the substrates can be uniform among the substrates.

However, in the aforementioned technique, since the opening shape of the gas exhaust port is determined for each substrate processing apparatus, there may be a case that the desired inter-plane uniformity is not obtained depending on a change in processing conditions or number of substrates to be processed. This is because the exhaust balance cannot be adjusted for each processing condition or the number of substrates to be processed.

SUMMARY

The present disclosure provides some embodiments of a substrate processing apparatus capable of controlling an inter-plane uniformity.

According to one embodiment of the present disclosure, there is provided a substrate processing apparatus including an inner tube installed to accommodate a plurality of substrates and having a first opening, an outer tube configured to surround the inner tube, a movable wall installed inside the inner tube or between the inner tube and the outer tube, configured to be movable, and having a second opening, a gas supply part configured to supply a process gas to the substrates and an exhaust part installed outside the movable wall and configured to exhaust the process gas supplied to the substrates.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 6A to 6F views illustrating a positional relationship between a first opening and a second opening when the movable wall of FIG. 4 is used.

FIG. 7 is a vertical sectional view illustrating an example of a rotation mechanism of the movable wall.

FIG. 8 is a view illustrating a substrate processing method according to the first embodiment.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. Further, in the present specification and drawings, substantially the same components will be denoted by the same reference numbers and a redundant description will be omitted.

First Embodiment (Substrate Processing Apparatus)

Figure 1:
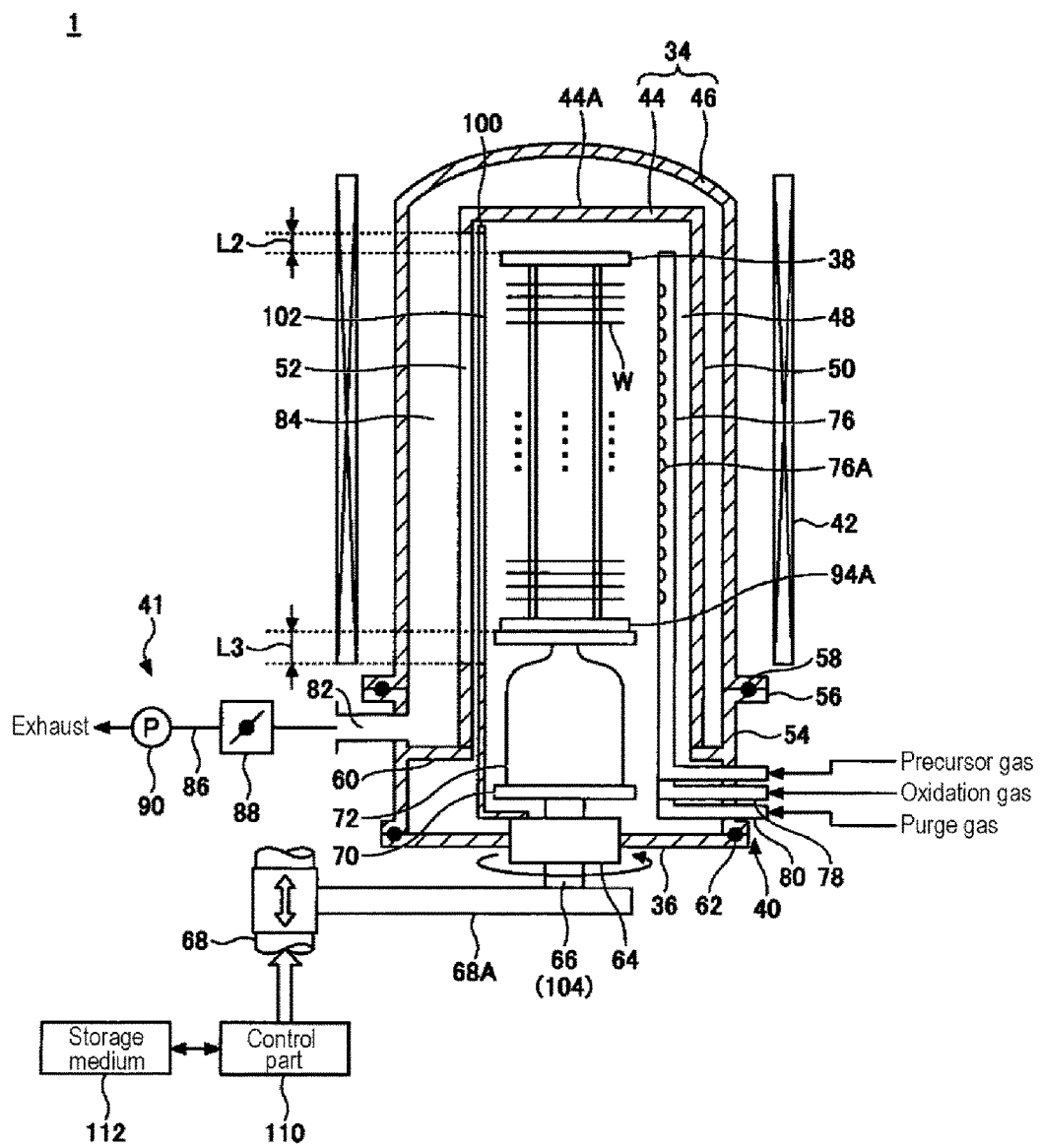
FIG. 1 is a schematic diagram of a substrate processing apparatus according to a first embodiment of the present disclosure.
Figure 2:
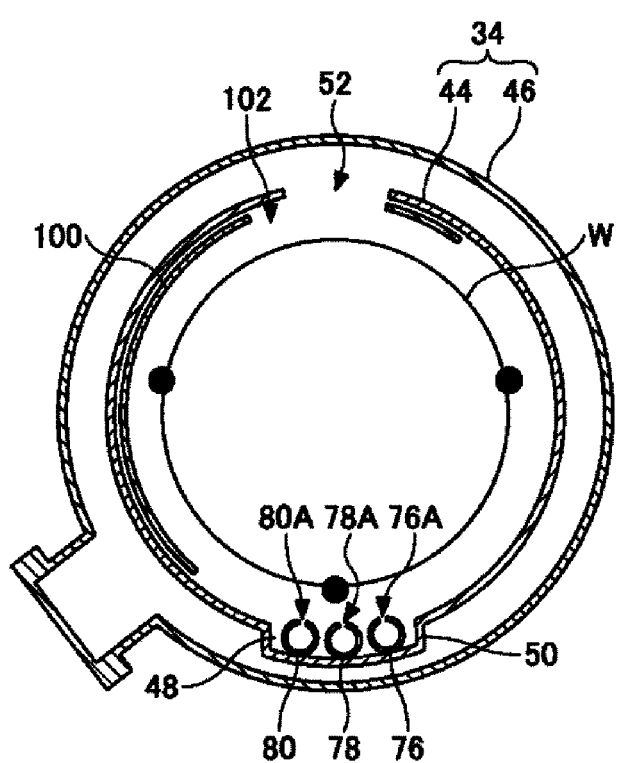
FIG. 2 is a cross sectional view illustrating a process vessel of the substrate processing apparatus of FIG. 1.
Figure 3:
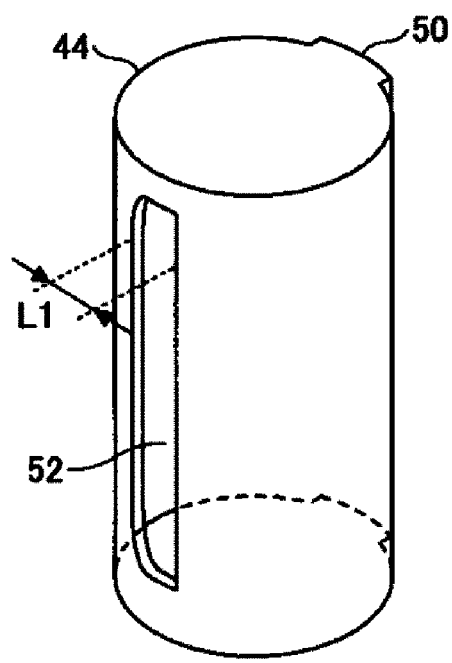
FIG. 3 is a perspective view illustrating an example of an inner pipe of the substrate processing apparatus of FIG. 1.
Figure 4:
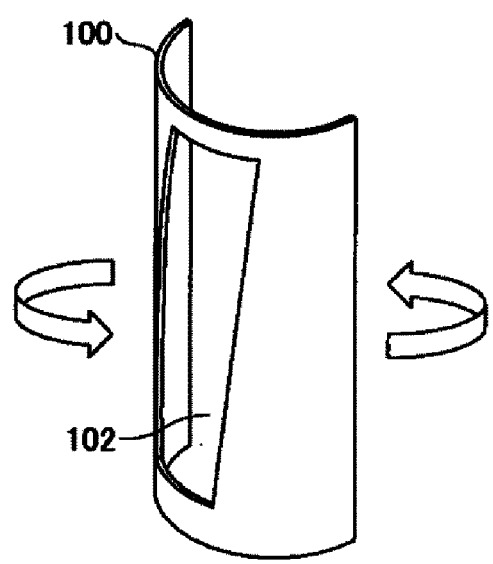
FIG. 4 is a perspective view illustrating an example of a movable wall of the substrate processing apparatus of FIG. 1.

A substrate processing apparatus according to a first embodiment of the present disclosure will be described. FIG. 1 is a schematic diagram of the substrate processing apparatus according to the first embodiment. FIG. 2 is a cross sectional view illustrating a process vessel of the substrate processing apparatus of FIG. 1. FIG. 3 is a perspective view illustrating an example of an inner tube of the substrate processing apparatus of FIG. 1. FIG. 4 is a perspective view illustrating an example of a movable wall of the substrate processing apparatus of FIG. 1.

As illustrated in FIG. 1, a substrate processing apparatus 1 includes a process vessel 34 that accommodates a semiconductor wafer (hereinafter, referred to as a "wafer W") as a substrate, a lid portion 36 that hermetically closes an opening of a lower end of the process vessel 34, a substrate support 38 that supports a plurality of wafers W at a predetermined interval and is inserted into and removed from the process vessel 34, a gas supply part 40 that introduces a predetermined gas into the process vessel 34, an exhaust part 41 that exhausts the gas within the process vessel 34, and a heating part 42 that heats the wafers W.

The process vessel 34 has a cylindrical inner tube 44 with its lower end opened and having a ceiling and a cylindrical outer tube 46 with its lower end opened, covering an outer side of the inner tube 44 and having a ceiling. The inner tube 44 and the outer tube 46 are formed of a heat resistant material such as quartz or the like, and coaxially arranged to have a double tube structure.

A ceiling portion of the inner tube 44 is, for example, flat. A nozzle housing portion 48 that houses gas nozzles is formed on one side of the inner tube 44 along its longitudinal direction (vertical direction). In the first embodiment, as illustrated in FIG. 2, a portion of a sidewall of the inner tube 44 protrudes outward to form a convex portion 50 and the interior of the convex portion 50 is formed as the nozzle housing portion 48.

Furthermore, as illustrated in FIG. 3, a first opening 52 having a rectangular shape with a width L1 is formed on a sidewall of the opposite side of the inner tube 44 to face the nozzle housing portion 48 along its longitudinal direction (vertical direction).

The first opening 52 is a gas exhaust port formed to exhaust the gas within the inner tube 44. The first opening 52 is formed such that a length of the first opening 52 may be equal to or greater than that of the substrate support 38 so as to extend in a vertical direction. That is, an upper end of the first opening 52 may extend to be higher than a position corresponding to an upper end of the substrate support 38, and a lower end of the first opening 52 may extend to be lower than a position corresponding to a lower end of the substrate support 38. Specifically, as illustrated in FIG. 1, a distance L2 between the upper end of the substrate support 38 and the upper end of the first opening 52 in a height direction falls within a range of about 0 to 5 mm. Furthermore, a distance L3 between the lower end of the substrate support 38 and the lower end of the first opening 52 in the height direction falls within a range of about 0 to about 350 mm. The width L1 of the first opening 52 falls within a range of about 10 mm to about 400 mm, specifically about 40 mm to 200 mm. In addition, two among four corner portions of the first opening 52 are chamfered.

The lower end of the process vessel 34 is supported by a cylindrical manifold 54 formed of, e.g., stainless steel. A flange portion 56 is formed at an upper end portion of the manifold 54, and a lower end portion of the outer tube 46 is installed on the flange portion 56 so as to be supported. A seal member 58 such as an O-ring or the like is interposed between the flange portion 56 and the lower end portion of the outer tube 46 to hermetically seal the interior of the outer tube 46.

A support portion 60 of a ring shape is installed on an inner wall of the upper portion of the manifold 54, and the lower end portion of the inner tube 44 is installed on the support portion 60 so as to be supported. The lid portion 36 is hermetically installed with a seal member 62 such as an O-ring or the like interposed at a lower end opening of the manifold 54 and is configured to hermetically close the lower end opening of the process vessel 34, i.e., the opening of the manifold 54. The lid portion 36 is formed of, e.g., stainless steel.

A rotary shaft 66 is installed to penetrate a central portion of the lid portion 36 through a magnetic fluid seal portion 64. A lower portion of the rotary shaft 66 is rotatably supported by an arm 68A of an elevating part 68 configured with a boat elevator and is configured to be rotated by a motor 69, as shown in FIG. 7.

A rotation plate 70 is installed at an upper end of the rotary shaft 66, and the substrate support 38 that supports the wafers W is loaded on the rotation plate 70 by interposing a heat insulating stand 72 made of quartz therebetween. Thus, the lid portion 36 and the substrate support 38 are integrally moved vertically by moving the elevating part 68 up and down so that the substrate support 38 can be inserted into or removed from the process vessel 34.

The gas supply part 40 is installed at the manifold 54 and introduces a gas such as a process gas, a purge gas or the like into the inner tube 44. The gas supply part 40 has a plurality of (e.g., three) gas nozzles 76, 78, and 80 made of quartz. Each of the gas nozzles 76, 78, and 80 is installed inside the inner tube 44 along its longitudinal direction, and a base end section thereof is bent in an L shape to be supported by penetrating the manifold 54.

As illustrated in FIG. 2, the gas nozzles 76, 78, and 80 are installed in the nozzle housing portion 48 of the inner tube 44 in a row along a circumferential direction. A plurality of gas holes 76A, 78A, and 80A is formed in the gas nozzles 76, 78, and 80 at a predetermined interval along their longitudinal directions, respectively, and each gas may be discharged from each of the gas holes 76A, 78A, and 80A in a horizontal direction. The predetermined interval is set to be, for example, equal to an interval between the wafers W supported by the substrate support 38. Furthermore, a position of each of the gas holes 76A, 78A, and 80A is set to be located in the middle between the wafers W, which are adjacent to each other in a vertical direction, to thereby effectively supply each gas to a space portion between the wafers W.

As the types of gases, a precursor gas, an oxide gas, and a purge gas may be used, and each gas may be supplied through each of the gas nozzles 76, 78, and 80 as necessary, while controlling a flow rate. A silicon oxide film may be formed by an atomic layer deposition (ALD) method using a silicon-containing gas as a precursor gas, an ozone ($O_3$) gas as an oxide gas, and a nitrogen ($N_2$) gas as a purge gas. In addition, the types of gases to be used may be suitably selected depending on the types of films to be formed.

Furthermore, a gas outlet 82 may be formed on a sidewall of the upper portion of the manifold 54 and on the upper side of the support portion 60 so as to allow the gas within the inner tube 44 discharged from the first opening 52 to be exhausted through the space portion 84 between the inner tube 44 and the outer tube 46. The exhaust part 41 is installed at the gas outlet 82. The exhaust part 41 has an exhaust passage 86 connected to the gas outlet 82, and a pressure regulation valve 88 and a vacuum pump 90 are sequentially installed in the exhaust passage 86, so that the interior of the process vessel 34 can be vacuumed. The width L1 of the first opening 52 is set to fall within a range of 10 mm to 400 mm to thereby effectively exhaust the gas within the inner tube 44.

The cylindrical heating part 42 configured to cover the outer tube 46 is installed on an outer peripheral side of the outer tube 46 to heat the wafers W.

In addition, a movable wall 100 is installed inside the inner tube 44 along an inner sidewall of the inner tube 44. As illustrated in FIG. 4, the movable wall 100 has a semi-cylindrical shape and a second opening 102 is formed on its sidewall.

The second opening 102 is a gas exhaust port formed to exhaust the gas within the inner tube 44. For example, as illustrated in FIG. 4, the second opening 102 has a shape different from that of the first opening 52, and has a parallelogram shape. For example, as illustrated in FIG. 1, an upper end of the second opening 102 extends to a height of a position corresponding to the upper end of the first opening 52. For example, as illustrated in FIG. 1, a lower end of the second opening 102 extends to a height of a position corresponding to the lower end of the first opening 52.

A rotary shaft 104 is installed to penetrate the movable wall 100 via the magnetic fluid seal portion 64. The rotary shaft 104 is configured to be movable (rotatable) by a motor 106, which is independent from the rotary shaft 66, as shown in FIG. 7. A position of the second opening 102 with respect to the first opening 52 may be changed by rotating the rotary shaft 104 to rotate the movable wall 100. Thus, a shape of a region (hereinafter, referred to as a "common opening (CA)") in which the first opening 52 and the second opening 102 overlap can be changed. As a result, it is possible to control a flow rate of the gas supplied to the surface of the wafer W by adjusting an exhaust balance of the gas within the inner tube 44.

Referring back to FIG. 1, an overall operation of the substrate processing apparatus 1 thus formed is controlled by a control part 110 configured with, for example, a computer or the like, and a program of the computer for performing such operation is stored in a storage medium 112. The storage medium 112 may be configured with, for example, a flexible disk, a compact disk, a hard disk, a flash memory, a DVD, or the like.

Figure 5A:
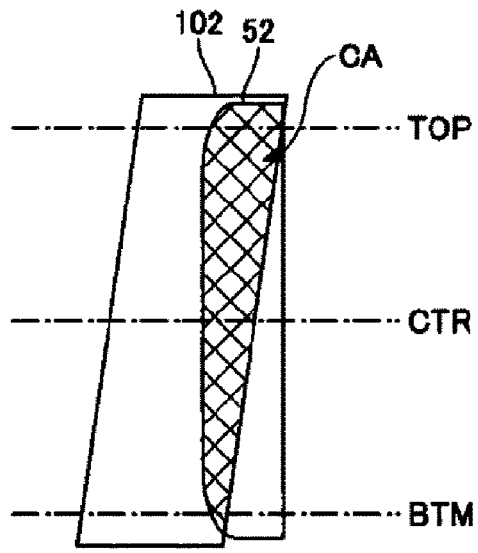
FIGS. 5A to 5D are views illustrating a common opening.
Figure 5B:
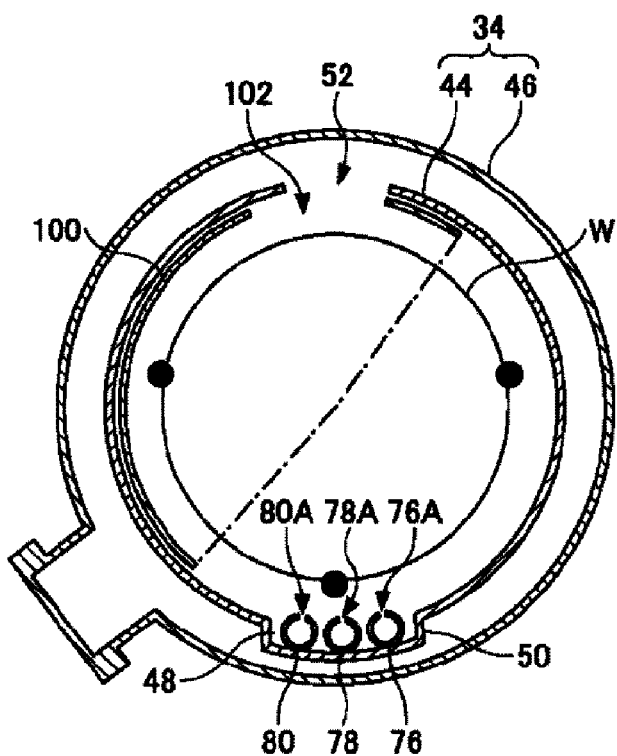
Figure 5C:
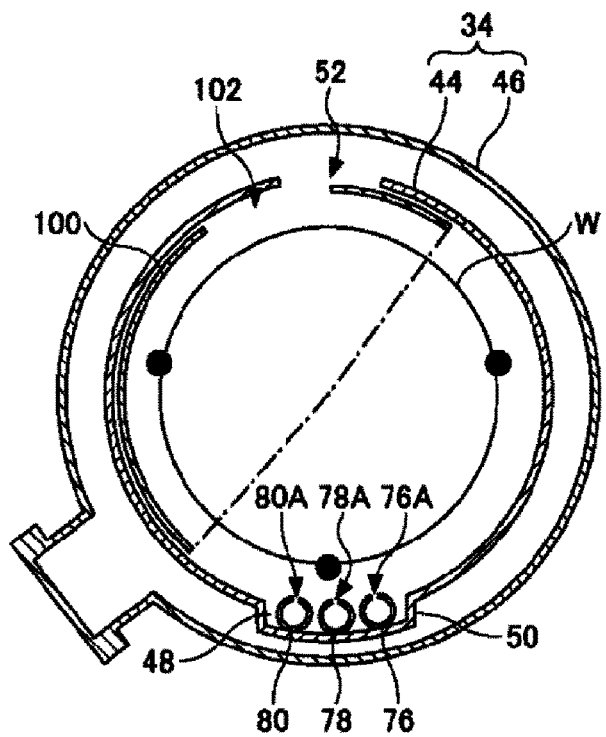
Figure 5D:
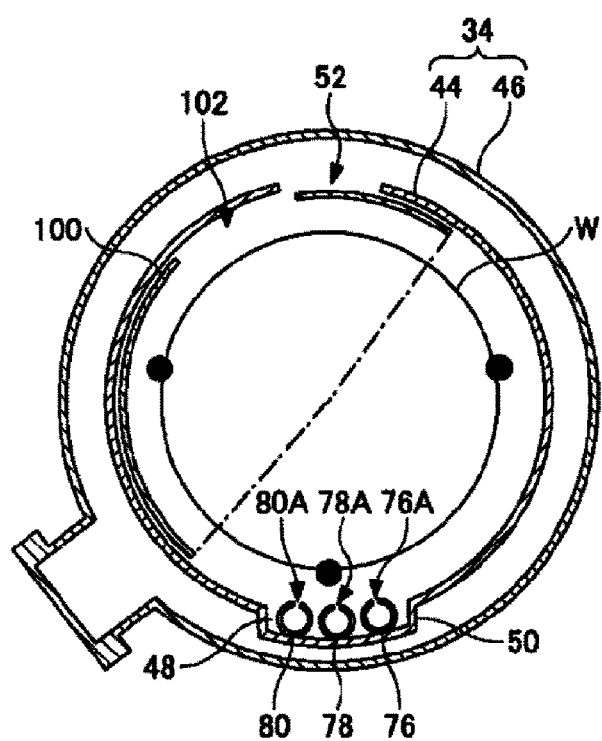

FIGS. 5A to 5D are views illustrating a common opening. FIG. 5A is a view illustrating the common opening when a portion of the second opening overlaps the first opening. FIG. 5B is a cross sectional view of the process vessel at a position indicated by "TOP" in FIG. 5A. FIG. 5C is a cross sectional view of the process vessel at a position indicated by "CTR" in FIG. 5A. FIG. 5D is a cross sectional view of the process vessel at a position indicated by "BTM" in FIG. 5A. Furthermore, "TOP" represents a position of a top side of the process vessel, "CTR" represents a position of a center portion of the process vessel, and "BTM" represents a position of a bottom side of the process vessel.

As illustrated in FIG. 5A, when the movable wall 100 is located such that a portion of the second opening 102 overlaps the first opening 52, an opening width of the common opening CA is narrowed from the TOP side toward the BTM side.

Specifically, at the position of "TOP", the second opening 102 fully overlaps the first opening 52 as illustrated in FIG. 5B. Therefore, an opening width of the common opening CA becomes a width of the first opening 52. Furthermore, at the position of "CTR", a portion of the second opening 102 overlaps the first opening 52 as illustrated in FIG. 5C. Therefore, an opening width of the common opening CA becomes a width of the portion in which the first opening 52 and the second opening 102 overlap and narrower than an opening width of the common opening CA at the position of "TOP". In addition, at the position of "BTM", a small portion of the second opening 102 overlaps the first opening 52 as illustrated in FIG. 5D. Therefore, an opening width of the common opening CA becomes a width of the portion in which the first opening 52 and the second opening 102 overlap and narrower than the opening width of the common opening CA at the position of "CTR". In this manner, the opening width of the common opening CA becomes narrower from the TOP side toward the BTM side.

FIGS. 6A to 6F are views illustrating a positional relationship between the first opening and the second opening when the movable wall of FIG. 4 is used. FIGS. 6A to 6F illustrate a change in a shape of the common opening CA when a position of the second opening 102 with respect to the first opening 52 is changed by moving (rotating) the movable wall 100.

As illustrated in FIGS. 6A to 6F, the shape of the common opening CA may be changed by rotating the movable wall 100.

In FIG. 6A, the first opening 52 and the second opening 102 do not overlap at all, and thus, an opening area of the common opening CA is 0. Thus, the gas within the inner tube 44 is not exhausted or hardly exhausted.

In FIG. 6B, the first opening 52 and the second opening 102 overlap in an upper portion of the first opening 52. In contrast, the first opening 52 and the second opening 102 do not overlap at a lower portion of the first opening 52. Thus, the gas within the inner tube 44 is not exhausted from the lower portion of the first opening 52 and is selectively exhausted from the upper portion of the first opening 52.

In FIG. 6C, the first opening 52 and the second opening 102 overlap at the upper and lower portions of the first opening 52, and a width of the overlapping portion is greater at the upper portion of the first opening 52 than the lower portion thereof. Thus, the gas within the inner tube 44 is more likely to be exhausted from the upper portion of the first opening 52 rather than the lower portion of the first opening 52.

In FIG. 6D, the second opening 102 fully overlaps the first opening 52. Thus, the gas within the inner tube 44 is exhausted from the entire first opening 52.

In FIG. 6E, the first opening 52 and the second opening 102 overlap at the upper and lower portions of the first opening 52, and a width of the overlapping portion is greater at the lower portion of the first opening 52 than the upper portion thereof. Thus, the gas within the inner tube 44 is more likely to be exhausted from the lower portion of the first opening 52 rather than the upper portion of the first opening 52.

In FIG. 6F, the first opening 52 and the second opening 102 overlap at the lower portion of the first opening 52. In contrast, the first opening 52 and the second opening 102 do not overlap at the upper portion of the first opening 52. Thus, the gas within the inner pipe 44 is not exhausted from the upper portion of the first opening and is selectively exhausted from the lower portion of the first opening 52.

In this manner, the shape of the common opening CA can be changed by rotating the movable wall 100. Thus, the exhaust balance may be adjusted depending on the processing conditions or the number of wafers to be processed by moving a position of the movable wall 100 depending on a change in the processing conditions or the number of waters to be processed. As a result, it is possible to obtain the desired inter-plane uniformity.

FIG. 7 is a vertical sectional view illustrating an example of a rotation mechanism of the movable wall.

As illustrated in FIG. 7, the rotation plate 70 and the movable wall 100 are configured to be rotatable independently by the dual-axis magnetic fluid seal portion 64 installed in the lid portion 36. Specifically, the rotation plate 70 is connected to a motor 69 through a rotary shaft 66 and a rotational speed and a rotation angle of the rotary shaft 66 are adjusted by the motor 69, so that the rotation plate 70 is rotated by a predetermined rotation angle at a predetermined rotational speed. The movable wall 100 is connected to a motor 106 through the rotary shaft 104, and a rotation angle and a rotational speed of the rotary shaft 104 are adjusted by the motor 106, so that the movable wall 100 is rotated by a predetermined rotation angle at a predetermined rotational speed.

Furthermore, a purge gas nozzle 108 is installed in a gap between the rotary shaft 66 and the rotary shaft 104 and in a gap between the rotary shaft 66 and the lid portion 36 to make it possible to supply a purge gas such as an $N_2$ gas or the like. Thus, it is possible to prevent a material generated by performing the substrate processing within the process vessel 34 from adhering to a magnetic fluid seal.

(Substrate Processing Method)

An example of a substrate processing method using the substrate processing apparatus 1 mentioned above will be described with reference to FIG. 8. FIG. 8 is a diagram illustrating the substrate processing method according to the first embodiment.

In the first embodiment, a case of forming a silicon oxide film on the surface of the wafer W by an ALD method using the substrate processing apparatus 1 will be described as an example. In this case, a silicon oxide film is formed on the surface of the wafer W by alternately supplying the silicon-containing gas as a precursor gas and an $O_3$ gas as an oxidation gas. In addition, when the silicon-containing gas and the $O_3$ gas are switched, the interior of the process vessel 34 is purged by supplying the $N_2$ gas as a purge gas.

First, the substrate support 38 on which e.g., 50 to 150 wafers W are mounted is elevated from its lower side so as to be loaded into the process vessel 34 set at a predetermined temperature in advance. Subsequently, the lower end opening of the manifold 54 is closed by the lid portion 36 to thereby hermetically seal the interior of the process vessel 34.

Thereafter, the interior of the process vessel 34 is vacuumed and maintained at a predetermined processing pressure, and electric power supplied to the heating part 42 is increased to raise the temperature of the wafer W to be maintained in a processing temperature.

Thereafter, the silicon-containing gas is supplied into the process vessel 34 from the gas nozzle 76 and adsorbed to the surface of the wafer W (step S1). At this time, for example, the movable wall 100 is moved such that an opening area of the common opening CA is 0, namely such that the first opening 52 and the second opening 102 do not overlap. Therefore, the gas within the inner tube 44 is not exhausted or hardly exhausted. Thus, the flow velocity of the silicon-containing gas supplied from the gas nozzle 76 can be reduced and the activity of the silicon-containing gas can be increased.

Thereafter, the supply of the silicon-containing gas from the gas nozzle 76 is stopped and the $N_2$ gas is supplied from the gas nozzle 80 into the process vessel 34 to purge the process vessel 34 (step S2). At this time, for example, the movable wall 100 is moved such that an opening area of the common opening CA is maximized, namely such that an overlapping region of the first opening 52 and the second opening 102 becomes maximized. Thus, it is possible to enhance the purge efficiency and to shorten the time necessary for purging the interior of the process vessel 34.

Thereafter, the supply of the $N_2$ gas from the gas nozzle 80 is stopped and the $O_3$ gas is supplied from the gas nozzle 78 into the process vessel 34 to oxidize the silicon-containing gas adsorbed to the surface of the wafer W (step S3). At this time, for example, the movable wall 100 is moved such that the overlapping region of the first opening 52 and the second opening 102 becomes greater at the upper portion of the first opening 52 than the lower portion of the first opening 52. Thus the a gas within the inner tube 44 is more likely to be exhausted from the upper portion of the first opening 52, which is a position away from the gas outlet 82, rather than the lower portion of the first opening 52, which is a position close to the gas outlet 82. Therefore, it is possible to make the flow velocity of the gas supplied to the surface of the wafer W between the wafers W uniform.

Thereafter, the supply of the $O_3$ gas from the gas nozzle 78 is stopped and the $N_2$ gas is supplied from the gas nozzle 80 into the process vessel 34 to purge the process vessel 34 (step S4). At this time, for example, the movable wall 100 is moved such that the opening area of the common opening CA is maximized, namely such that the overlapping region of the first opening 52 and the second opening 102 overlap becomes maximized. Thus, it is possible to enhance the purge efficiency and to shorten the time necessary for purging the interior of the process vessel 34.

By repeating steps S1 to S4 described above a predetermined number of times, a silicon oxide film having a desired film thickness can be formed on the surface of the wafer W.

In the substrate processing method according to the first embodiment, the flow velocity of the gas supplied to the surface of the wafer W can be controlled by adjusting the exhaust balance of the gas within the inner tube 44 by moving the movable wall 100 according to the processing conditions. As a result, it is possible to obtain the desired inter-plane uniformity.

Furthermore, in the substrate processing method according to the first embodiment, although a case of moving the movable wall 100 whenever the gas supplied to the process vessel 34 is switched has be described as an example, but the timing of moving the movable wall 100 may not be limited thereto.

Second Embodiment

Figure 9:
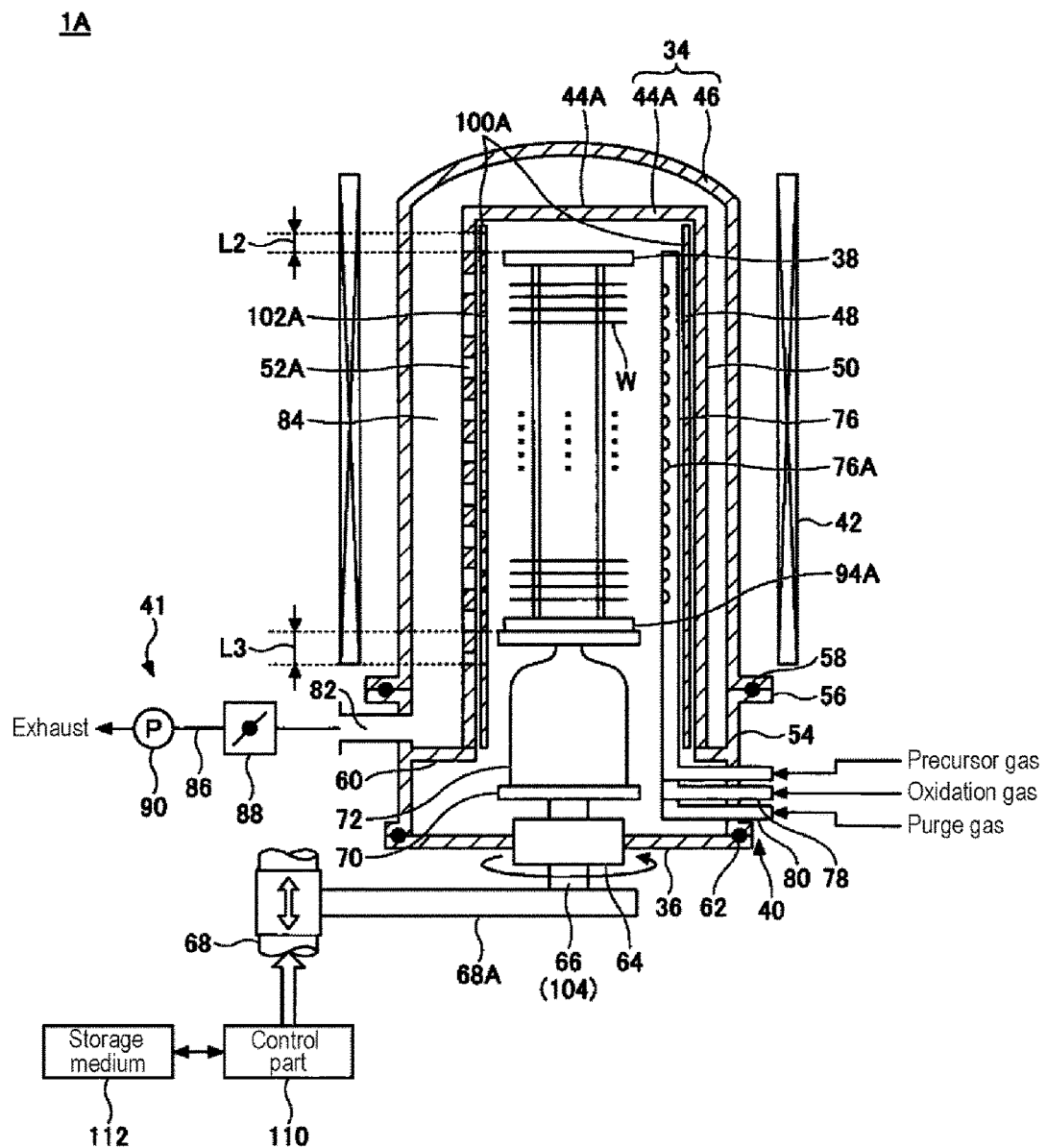
FIG. 9 is a schematic diagram of a substrate processing apparatus according to a second embodiment of the present disclosure.
Figure 10:
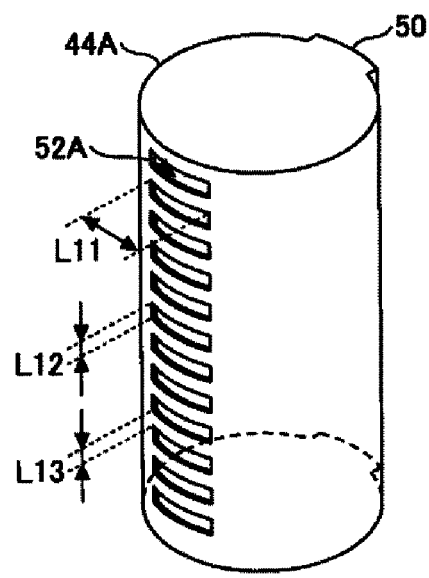
FIG. 10 is a perspective view illustrating an example of an inner pipe of the substrate processing apparatus of FIG. 9.
Figure 11:
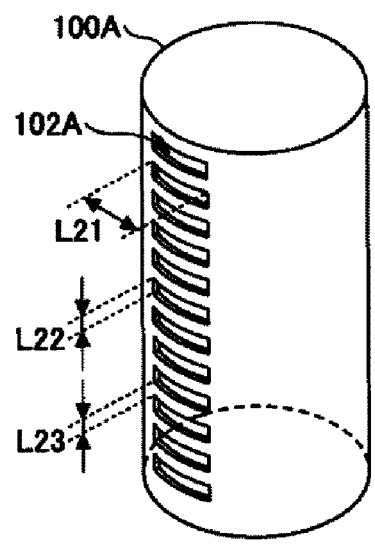
FIG. 11 is a view illustrating an example of a movable wall of the substrate processing apparatus of FIG. 9.

A substrate processing apparatus according to a second embodiment of the present disclosure will be described. FIG. 9 is a schematic diagram of the substrate processing apparatus according to the second embodiment. FIG. 10 is a perspective view illustrating an example of an inner tube of the substrate processing apparatus of FIG. 9. FIG. 11 is a view illustrating an example of a movable wall of the substrate processing apparatus of FIG. 9.

A substrate processing apparatus 1A according to the second embodiment has an inner tube 44A and a movable wall 100A that are different from those of the substrate processing apparatus 1 according to the first embodiment mentioned above. Furthermore, since other configurations are the same as those of the substrate processing apparatus 1 according to the first embodiment, descriptions of the same configurations as those of the substrate processing apparatus 1 according to the first embodiment will be omitted, and different configurations will be described.

As illustrated in FIG. 10, a plurality of rectangular openings each having a width L11 and a length L12 is formed in the inner tube 44A at a first interval L13 along a longitudinal direction (vertical direction) of the inner tube 44A to thereby form a first opening 52A.

The first opening 52A is a gas exhaust port formed to exhaust the gas within the inner tube 44. An upper end of the rectangular opening located at the uppermost position of the first opening 52A may extend to a height equal to or higher than a position corresponding to an upper end of the substrate support 38. Furthermore, a lower end of the rectangular opening located at the lowermost position of the first opening 52A may extend to a height equal to or lower than a position corresponding to a lower end of the substrate support 38. Specifically, as illustrated in FIG. 9, a distance L2 between the upper end of the substrate support 38 and the upper end of the rectangular opening located at the uppermost position of the first opening 52A in a height direction is within a range of about 0 to 5 mm. Furthermore, a distance L3 between the lower end of the substrate support 38 and the lower end of the rectangular opening located at the lowermost position of the first opening 52A in the height direction is within a range of about 0 to about 350 mm.

In addition, the movable wall 100A is installed inside the inner tube 44A along an inner sidewall of the inner tube 44A. As illustrated in FIG. 11, the movable wall 100A has a cylindrical shape and a second opening 102A is formed in its sidewall.

The second opening 102A is a gas exhaust port formed to exhaust the gas within the inner tube 44A. For example, as illustrated in FIG. 11, a plurality of second openings 102A is formed as a rectangular opening having a width L21 and a length L22 is formed at a second interval L23 along a longitudinal direction (vertical direction) of the inner tube 44 A. The second opening 102A is formed such that the second interval L23 is smaller than the first interval L13.

An elevating mechanism (not shown) is connected to the movable wall 100A, and the movable wall 100A is configured to be moved up and down (to be movable) by the elevating mechanism. A position of the second opening 102A with respect to the first opening 52A may be changed by operating the elevating mechanism to move the movable wall 100A up and down. That is, the position of the common opening CA may be changed. Thus, it is possible to control a flow rate of the gas supplied to the surface of the wafer W by adjusting an exhaust balance of the gas within the inner tube 44.

Figure 12A:
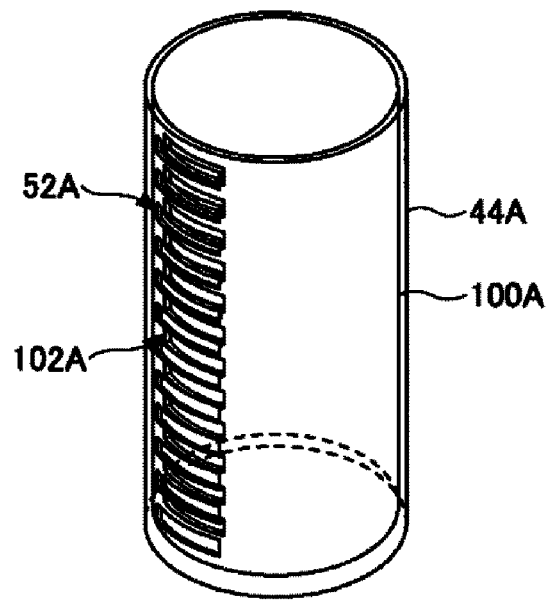
FIGS. 12A and 12B are views illustrating a positional relationship between a first opening and a second opening when the movable wall of FIG. 11 is used.
Figure 12B:
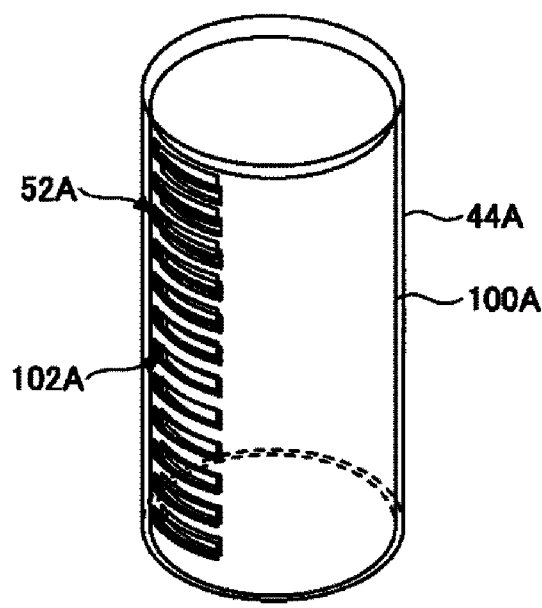

FIGS. 12A and 12B are views illustrating a positional relationship between the first opening and the second opening when the movable wall of FIG. 11 is used. FIGS. 12A and 12B illustrate a change in a position of the common opening CA when a position of the second opening 102A with respect to the first opening 52A is changed by moving (elevating) the movable wall 100A.

As illustrated in FIGS. 12A and 12B, the position of the common opening CA may be changed by moving the movable wall 100 up and down.

As illustrated in FIG. 12A, when the movable wall 100A is moved upward such that the upper end of the rectangular opening located at the uppermost position of the first opening 52A and the upper end of the rectangular opening located at the uppermost position of the second opening 102A coincide with each other, since the second interval L23 is smaller than the first interval L13, an overlapping area of the first opening 52A and the second opening 102A becomes larger at the upper side of the first opening 52A and an overlapping area of the first opening 52A and the second opening 102A becomes smaller at the lower side of the first opening 52A. Thus, a gas within the inner tube 44A is more likely to be exhausted from the upper side of the first opening 52A rather than the lower side of the first opening 52A.

As illustrated FIG. 12B, when the movable wall 100A is moved downward such that the lower end of the rectangular opening located at the lowermost position of the first opening 52A and the lower end of the rectangular opening located at the lowermost position of the second opening 102A coincide with each other, since the second interval L23 is smaller than the first interval L13, an overlapping area of the first opening 52A and the second opening 102A becomes larger at the lower side of the first opening 52A and an overlapping area of the first opening 52A and the second opening 102A becomes smaller at the upper side of the first opening 52A. Thus, the gas within the inner tube 44A is more likely to be exhausted from the lower side of the first opening 52A rather than the upper side of the first opening 52A.

As described above, the position of the common opening CA can be changed by moving the movable wall 100A up and down. Thus, it is possible to adjust the exhaust balance depending on the processing conditions or the number of wafers to be processed by moving the position of the movable wall 100A depending on a change in the processing conditions or the number of wafers to be processed. As a result, it is possible to obtain the desired inter-plane uniformity.

Third Embodiment

Figure 13:
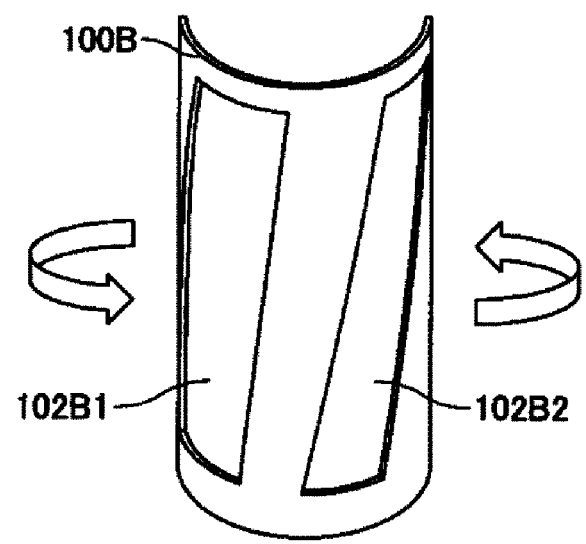
FIG. 13 is a view illustrating an example of a movable wall of a substrate processing apparatus according to a third embodiment of the present disclosure.

A substrate processing apparatus according to a third embodiment of the present disclosure will be described. FIG. 13 is a view illustrating an example of a movable wall of the substrate processing apparatus according to the third embodiment.

The substrate processing apparatus according to the third embodiment has a movable wall 100B that is different from that of the substrate processing apparatus 1 according to the first embodiment mentioned above. Furthermore, since other configurations are the same as those of the substrate processing apparatus 1 according to the first embodiment, descriptions of the same configurations as those of the substrate processing apparatus 1 according to the first embodiment will be omitted, and different configurations will be described.

As illustrated in FIG. 13, the movable wall 100B has a semi-cylindrical shape, and second openings 102B1 and 102B2 are formed thereon.

The second openings 102B1 and 102B2 are gas exhaust ports formed to exhaust the gas within the inner tube 44. The second openings 102B1 and 102B2 are formed in a shape different from that of the first opening 52. Furthermore, the second openings 102B1 and 102B2 have different shapes and are formed in, for example, a parallelogram shape having different angles formed by two sides that are not parallel with each other. FIG. 13 illustrates a case where the shape of the second opening 102B1 is the same as that of the second opening 102 mentioned above. In addition, the shapes of the second openings 102B1 and 102B2 are not limited thereto, and various shapes may be used.

A positional relationship between the first opening 52 and the second openings 102B1 and 102B2 will be described.

The positional relationship between the first opening 52 and the second opening 102B1 is the same as that in the first embodiment, and thus, a description thereof will be omitted.

FIGS. 14A to 14F are views illustrating a positional relationship between the first opening 52 and the second opening 102B2 when the movable wall 100B of FIG. 13 is used. FIGS. 14A to 14F illustrate a change in a shape of the common opening CA when a position of the second opening 102B2 with respect to the first opening 52 is changed by moving (rotating) the movable wall 100B.

As illustrated in FIGS. 14A to 14F, the shape of the common opening CA may be changed by rotating the movable wall 100B.

Figure 14A:
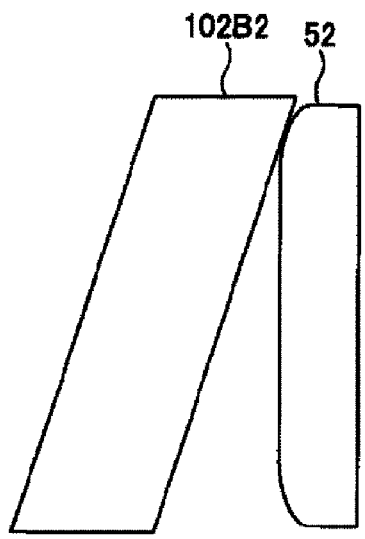
FIGS. 14A to 14F are views illustrating a positional relationship between a first opening and a second opening when the movable wall of FIG. 13 is used.

In FIG. 14A, the first opening 52 and the second opening 102B2 do not overlap at all, and thus, an opening area of the common opening CA is 0. Thus, the gas within the inner tube 44 is not exhausted or hardly exhausted.

Figure 14B:
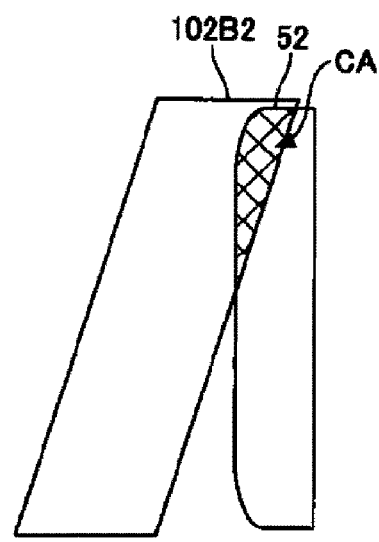

In FIG. 14B, the first opening 52 and the second opening 102B2 overlap in an upper portion of the first opening 52. In contrast, the first opening 52 and the second opening 102B2 do not overlap at a lower portion of the first opening 52. Thus, the gas within the inner tube 44 is not exhausted from the lower portion of the first opening 52 and is selectively exhausted from the upper portion of the first opening 52.

Figure 14C:
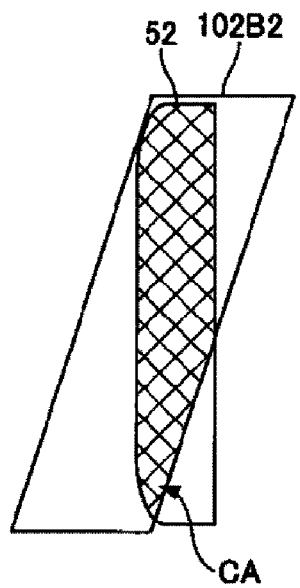

In FIG. 14C, the first opening 52 and the second opening 102B2 overlap at the upper and lower portions of the first opening 52 and a width of the overlapping portion is greater at the upper portion of the first opening 52 than the lower portion thereof. Furthermore, the first opening 52 and the second opening 102B2 fully overlap at a height from the upper portion of the first opening 52 to the central portion thereof. That is, the common opening CA has an I shape at the upper portion of the first opening 52 over the central portion thereof and has a V shape at the lower portion of the first opening 52 below the central portion thereof. Thus, the gas within the inner tube 44 is more likely to be exhausted from the upper portion of the first opening 52 rather than the lower portion of the first opening 52.

Figure 14D:
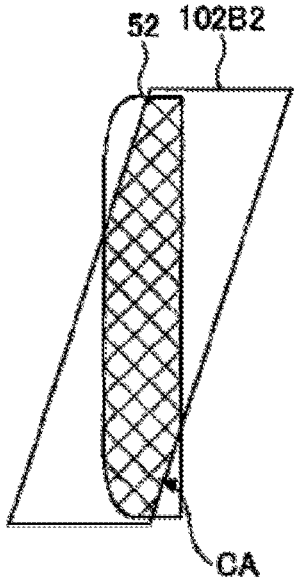

In FIG. 14D, the second opening 102B2 almost fully overlaps the first opening 52. Thus, the gas within the inner tube 44 is exhausted from the entire first opening 52.

Figure 14E:
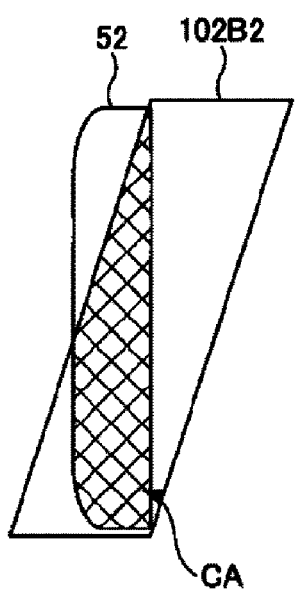

In FIG. 14E, the first opening 52 and the second opening 102B2 overlap at the upper and lower portions of the first opening 52, and a width of the overlapping portion is greater at the lower portion of the first opening 52 than the upper portion thereof. Furthermore, the first opening 52 and the second opening 102B2 fully overlap at a height from the lower portion of the first opening 52 to the central portion thereof. That is, the common opening CA has a V shape at the upper portion of the first opening 52 over the central portion thereof and has an I shape at the lower portion of the first opening 52 below the central portion thereof. Thus, the gas within the inner tube 44 is more likely to be exhausted from the lower portion of the first opening 52 rather than the upper portion of the first opening 52.

Figure 14F:
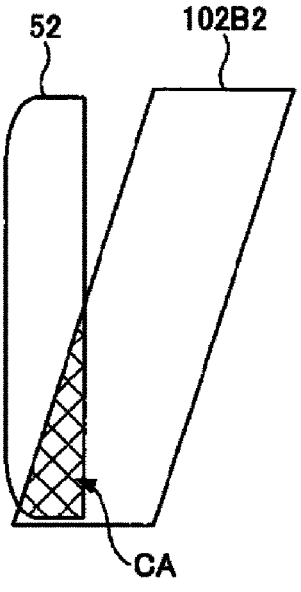

In FIG. 14F, the first opening 52 and the second opening 102B2 overlap at the lower portion of the first opening 52. In contrast, the first opening 52 and the second opening 102B2 do not overlap at the upper portion of the first opening 52. Thus, the gas within the inner tube 44 is not exhausted from the upper portion of the first opening 52 and is selectively exhausted from the lower portion of the first opening 52.

In this manner, in the substrate processing apparatus according to the third embodiment, one of the second opening 102B1 or the second opening 102B2 can overlap the first opening 52 by rotating the movable wall 100B. Thus, it is possible to increase a variation of the shape of the common opening CA. Therefore, the exhaust balance can be more finely adjusted rather than the first embodiment. As a result, it is possible to control an inter-plane uniformity with higher precision.

Furthermore, in the third embodiment, a case where one first opening 52 is formed in the inner tube 44 has been described as an example, but a plurality of first openings 52 may be formed. In this case, it is desirable that the shapes of the plurality of first openings 52 are different from each other. Thus, it is possible to further increase a variation of the shape of the common opening CA formed by superimposing the first opening 52 and the second openings 102B1 and 102B2. In this case, the number of the second openings may be one or plural.

EXAMPLES

Figure 15A:
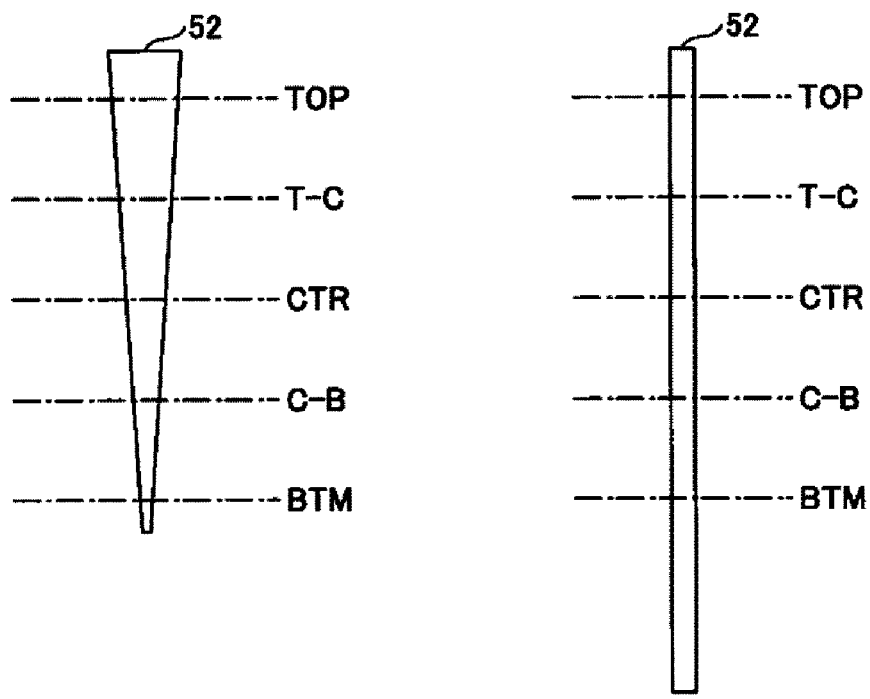
FIGS. 15A and 15B are diagrams illustrating an inter-plane uniformity
Figure 15B:
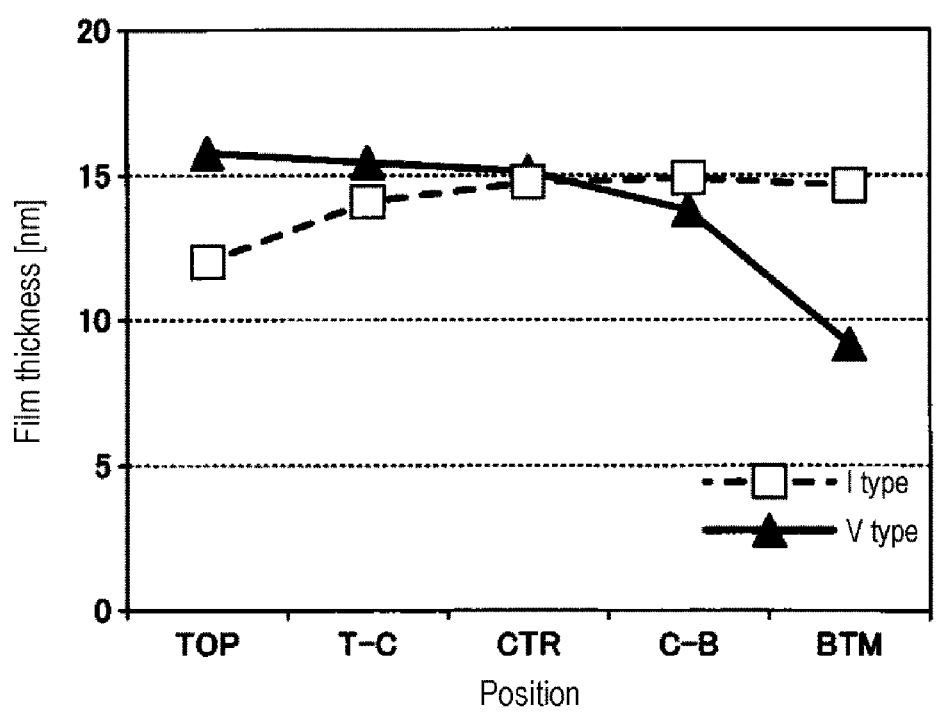

An inter-plane uniformity of a thickness of a film formed on the surface of the wafer W when the shape of the common opening CA is changed will be described. FIGS. 15A and 15B are diagrams illustrating an inter-plane uniformity. FIG. 15A is a diagram illustrating the shape of the first opening. FIG. 15B illustrates a relationship between a position of the wafer W and a thickness of a silicon oxide film formed on the wafer W. In FIG. 15B, the horizontal axis represents a position of the wafer W, and the vertical axis represents a thickness (nm) of the silicon oxide film formed on the surface of the wafer W. Furthermore, in FIG. 15B, "TOP" represents a position of an upper portion of the process vessel, "CTR" represents a position of a central portion of the process vessel, and "BTM" represents a position of a lower portion of the process vessel. In addition, in FIGS. 15A and 15B, "T-C" represents a position between "TOP" and "CTR", and "C-B" represents a position between "CTR" and "BTM".

In FIGS. 15A and 15B, a case of forming a silicon oxide film using a hexadichlorosilane (HCD) gas as a precursor gas and the $O_3$ gas as an oxide gas will be described as an example. Furthermore, in an example, a shape of the common opening CA, which was varied by changing the shape of the first opening 52, was quasi-formed. Specifically, the shape of the first opening 52 was changed to a V shape (illustrated on the left side of FIG. 15A or an I shape, as illustrated on the right side of FIG. 15A.

As illustrated in FIG. 15B, it can be seen that the inter-plane uniformities of thicknesses of silicon oxide films formed on the wafers W are significantly different when the first opening 52 has a V shape and an I shape. Specifically, when the first opening 52 has a V shape, the thickness of the silicon oxide film formed on the wafer W is thin at the position of "BTM". This is because the HCD gas supplied to the BTM side may flow to the TOP side where the opening area of the first opening 52 is large, within the inner tube 44. In contrast, when the first opening 52 has an I shape, the thickness of the silicon oxide film formed on the wafer W at the position of "BTM" is thicker than that of the silicon oxide film formed when the first opening 52 has the V shape, obtaining an enhanced inter-plane uniformity. This is because an opening width at the position of "TOP" is narrow, compared with the case where the first opening 52 has the V shape, and thus, the HCD gas supplied to the BTM side does not flow toward the TOP side within the inner tube 44.

As described above, since the inter-plane uniformity of the thickness of the film formed on the surface of the wafer W can be controlled by changing the shape of the first opening 52, the inter-plane uniformity of the thickness of the film, which is formed on the surface of the wafer W, can be controlled by changing the shape of the common opening CA.

While the embodiments for carrying out the present disclosure have been described above, the above contents do not limit the contents of the present disclosure, and various modifications and improvements are possible within the scope of the present disclosure.

In the aforementioned embodiments, there has been described an example in which the movable wall 100 is installed along the inner wall of the inner tube 44, but the present disclosure is not limited thereto. For example, the movable wall 100 may be installed between the inner tube 44 and the outer tube 46. In this case, the movable wall 100 is installed along the outer wall of the inner tube 44.

Furthermore, in the aforementioned embodiments, there has been described a case where the silicon oxide film is formed as an example, but the present disclosure may be applied regardless of the kind of a film to be formed. Moreover, in the aforementioned embodiments, there has been described a case of using an ALD method as an example, but the present disclosure is not limited thereto but may be applied to, e.g., a case of using a CVD method.

In addition, in the aforementioned embodiments, there has been described a film forming process without using plasma, but the present disclosure is not limited thereto but may be applied to a case of performing a film forming process using plasma. In this case, for example, a power plate for applying a high-frequency power for plasma generation is installed on the outer side of the partition wall of the convex portion 50 that partitions the nozzle housing portion 48 along its longitudinal direction to generate plasma.

Furthermore, in the aforementioned embodiments, a semiconductor wafer as a substrate has been described as an example, but the semiconductor wafer includes a silicon substrate and a compound semiconductor substrate such as GaAs, SiC, or GaN. In addition, the present disclosure is not limited to those substrates but may be applied to a glass substrate, a ceramic substrate, or the like used in a liquid crystal display device.

According to the present disclosure in some embodiments, it is possible to control an inter-plane uniformity by the disclosed substrate processing apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
    an inner tube installed to accommodate a plurality of substrates, and having a first opening;
    an outer tube configured to surround the inner tube;
    a movable wall installed inside the inner tube or between the inner tube and the outer tube, and having a second opening;
    a rotary shaft coupled to the movable wall and configured to rotate to move the movable wall;
    a gas supply part configured to supply a process gas to the substrates;
    an exhaust part installed outside the movable wall, and configured to exhaust the process gas supplied to the substrates; and
    a control part configured to control an operation of the rotary shaft,
    wherein the control part is further configured to control the operation of the rotary shaft to change a shape of an opening formed by overlapping the first opening and the second opening.

2. The apparatus of claim 1, wherein the exhaust part is configured to exhaust the process gas supplied to the substrates through the first opening and the second opening.

3. The apparatus of claim 1, wherein the movable wall is installed along a sidewall of the inner tube.

4. The apparatus of claim 3, wherein the movable wall has a semi-cylindrical shape.

5. The apparatus of claim 3, wherein the movable wall has a cylindrical shape.

6. The apparatus of claim 1, wherein the second opening has a shape different from a shape of the first opening.

7. The apparatus of claim 1, wherein the rotary shaft is further configured to move the movable wall along a circumferential direction of the inner tube.

8. The apparatus of claim 7, wherein the first opening has a rectangular shape, and the second opening has a parallelogram shape.

9. The apparatus of claim 1, wherein the rotary shaft is further configured to move the movable wall along a vertical direction of the inner tube.

10. The apparatus of claim 9, wherein the first opening has a plurality of openings formed at a first interval along a longitudinal direction of the inner tube, and
    the second opening has a plurality of openings formed at a second interval along a longitudinal direction of the inner tube, the first interval being different from the second interval.

* * * * *